(12) United States Patent
Nitta et al.

(10) Patent No.: US 11,974,404 B2
(45) Date of Patent: Apr. 30, 2024

(54) METHOD OF PRODUCING CIRCUIT BOARDS

(71) Applicant: TOPPAN INC., Tokyo (JP)

(72) Inventors: Yuki Nitta, Tokyo (JP); Takeshi Tamura, Tokyo (JP); Masashi Sawadaishi, Tokyo (JP); Takashi Fujita, Tokyo (JP)

(73) Assignee: TOPPAN INC., Tokyo (JP)

( * ) Notice: Subject to any disclaimer, the term of this patent is extended or adjusted under 35 U.S.C. 154(b) by 359 days.

(21) Appl. No.: 17/527,352

(22) Filed: Nov. 16, 2021

(65) Prior Publication Data

US 2022/0078921 A1    Mar. 10, 2022

Related U.S. Application Data

(63) Continuation of application No. PCT/JP2020/020382, filed on May 22, 2020.

(30) Foreign Application Priority Data

| May 23, 2019 | (JP) | ................................ 2019-096607 |
| May 29, 2019 | (JP) | ................................ 2019-100079 |
| Jun. 7, 2019 | (JP) | ................................ 2019-107364 |

(51) Int. Cl.
| *H05K 3/46* | (2006.01) |
| *H01L 23/14* | (2006.01) |
| *H01L 23/32* | (2006.01) |
| *H05K 1/14* | (2006.01) |
| *H05K 3/28* | (2006.01) |
(Continued)

(52) U.S. Cl.
CPC ............. *H05K 3/46* (2013.01); *H01L 23/142* (2013.01); *H01L 23/32* (2013.01); *H05K 1/14* (2013.01); *H05K 3/284* (2013.01); *H05K 3/305* (2013.01); *H05K 3/3436* (2013.01); *H05K 3/36* (2013.01); *H05K 2201/10378* (2013.01)

(58) Field of Classification Search
CPC ...... H05K 3/284; H05K 3/305; H05K 3/3436; H05K 3/36; H05K 3/46
See application file for complete search history.

(56) References Cited

U.S. PATENT DOCUMENTS

| 2003/0082846 A1 | 5/2003 | Yoneda et al. |
| 2009/0200684 A1 | 8/2009 | Masuda et al. |

FOREIGN PATENT DOCUMENTS

| JP | 2002-280490 A | 9/2002 |
| JP | 4513222 B2 | 7/2010 |
(Continued)

OTHER PUBLICATIONS

Extended European Search Report issued in connection with EP Appl. Ser. No. 20810059.4 dated Jun. 1, 2022 (5 pages).
(Continued)

*Primary Examiner* — Jeremy C Norris
(74) *Attorney, Agent, or Firm* — Foley & Lardner LLP

(57) ABSTRACT

There is provided a method of producing circuit boards, including a bonding step of bonding joints of an FC-BGA circuit board component with respective joints of an interposer, followed by a resin supply step of filling an underfill in a gap between the FC-BGA circuit board component and the interposer, a resin curing step of curing the underfill, and a support release step of releasing a support from the interposer, which are performed through a sequence of the support release step, the resin supply step, and the resin curing step.

12 Claims, 12 Drawing Sheets

(51) Int. Cl.
  *H05K 3/30* (2006.01)
  *H05K 3/34* (2006.01)
  *H05K 3/36* (2006.01)

(56) References Cited

FOREIGN PATENT DOCUMENTS

| JP | 2014-225671 A | 12/2014 |
| JP | 2016-175459 A | 10/2016 |
| WO | WO-2005/093829 A1 | 10/2005 |
| WO | WO 2018/047861 A1 | 3/2018 |

OTHER PUBLICATIONS

International Searching Authority, "International Search Report," issued in connection with International Patent Application No. PCT/020382, dated Aug. 25, 2020, 5 pages.

International Searching Authority, "Written Opinion," issued in connection with International Patent Application No. PCT/JP2020/020382, dated Aug. 25, 2020, 3 pages.

METHOD OF PRODUCING CIRCUIT BOARDS

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/020382, filed on May 22, 2020, which is based upon and claims the benefit of priority to Japanese Patent Application No. 2019-096607, filed on May 23, 2019; Japanese Patent Application No. 2019-100079, filed on May 29, 2019; and, Japanese Patent Application No. 2019-107364, filed on Jun. 7, 2019; the disclosures of which are incorporated herein by reference in their entireties.

[Technical Field]

The present invention relates to methods of producing circuit boards.

BACKGROUND

In recent years, with the progress of high speed and high integration of semiconductor devices, FC-BGA (flip chip-ball grid array) circuit board components are required to have narrow-pitch connection terminals for semiconductor elements and to have fine circuit board wiring patterns. On the other hand, for connection with mother boards, FC-BGA circuit board components are required to have connection terminals with pitches remaining substantially unchanged from conventional art.

In order to achieve narrow-pitch connection terminals for semiconductor elements and to achieve fine circuit board wiring patterns, PTL 1, for example, proposes a method in which a wiring pattern is formed on a silicon material to obtain a substrate (silicon interposer) for connection with semiconductor elements, and this substrate is connected to an FC-BGA circuit board component. Furthermore, PTL 2, for example, proposes a method in which a surface of an FC-BGA circuit board component is flattened such as by chemical mechanical polishing (CMP) and then a fine wiring pattern is formed. Also, PTL 3, for example, proposes a method in which a substrate including a fine wiring pattern layer (interposer) is formed on a support and then mounted on an FC-BGA circuit board component, followed by releasing the support to form a narrow-pitch circuit board.

[Citation List] [Patent Literature] PTL 1: JP 2002-280490 A; PTL 2: JP 2014-225671 A; PTL 3: WO2018/047861.

SUMMARY OF THE INVENTION

[Technical Problem]

In the method disclosed in PTL 1, the silicon interposer is prepared using a silicon wafer and using equipment for preprocessing semiconductors. Silicon wafers are limited in shape and size and the number of interposers that can be prepared from one wafer is small. In addition, since the preparation equipment is expensive, prepared interposers are also expensive. Problematically, silicon wafers, which are made of semiconductor materials, tend to deteriorate in transmission characteristics.

The method disclosed in PTL 2 raises no issue of transmission characteristics deterioration as in the method disclosed in PTL 1. However, this method raises an issue of lowering yield due to production defects in the FC-BGA circuit board components, coupled with defects caused when forming the difficult fine wiring patterns, or an issue of mounting semiconductor elements on an FC-BGA circuit board component that may have warpage or strain.

The method disclosed in PTL 3 raises no issue of transmission characteristics deterioration as in the method disclosed in PTL 1, or issue of lowering yield as in the method disclosed in PTL 2. However, the method disclosed in PTL 3 raises an issue of easily causing defects in the step of releasing a support and thus lowering yield.

The present invention has been made in light of the issues set forth above and aims to provide a method of producing circuit boards with higher productivity by improving yield in the step of releasing a support.

[Solution to Problem]

In order to solve the issues set forth above, the present invention provides a method of producing circuit boards, the circuit boards each including a first circuit board component and a second circuit board component, the second circuit board component having a bonding surface on which a wiring pattern finer than that of the first circuit board component is formed and to which the first circuit board component is bonded, the second circuit board component having a surface on which semiconductor elements are mounted that faces away from the bonding surface. The method is characterized by a second circuit board component preparation step of preparing the second circuit board component by performing a step of forming first electrodes on a support via a release layer for bonding to the semiconductor elements, a step of forming a multi-wiring layer, which is a laminate of a plurality of insulating resin layers and wiring layers, on the first electrodes, and a step of forming second electrodes on the multi-wiring layer for bonding to the first circuit board component; and a bonding step of bonding third electrodes of the first circuit board component to be connected to the second circuit board component, with the respective second electrodes of the second circuit board component. These steps are followed by a resin supply step of filling a sealing resin in a gap between the first circuit board component and the second circuit board component; a resin curing step of curing the sealing resin; and a support release step of releasing the support from the second circuit board component via the release layer, which are performed through any one of the following sequences which are: (1) the support release step, the resin supply step, and the resin curing step; (2) the resin supply step, the support release step, and the resin curing step; and (3) the resin supply step, a resin removal step of removing the sealing resin adhered to outer peripheries of the second circuit board component, the release layer, and the support, the resin curing step, and the support release step.

[Advantageous Effects of the Invention]

According to the method of producing circuit boards of the present invention, yield can be improved in the step of releasing a support to thereby produce circuit boards with higher productivity.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

With reference to the drawings, some embodiments of a method of producing circuit boards of the present invention will be described.

<First Embodiment>

Referring to FIGS. 1, 2, 3A to 3N, 4A, 4B, and 5A to 5D, a first embodiment of a method of producing circuit boards of the present invention will be described.

A circuit board produced using a production method according to the present embodiment has a structure in which a first circuit board component is bonded to a bonding surface of a second circuit board component on which a wiring pattern finer than that of the first circuit board component is formed, and semiconductor elements are mounted to a surface of the second circuit board component facing away from the bonding surface.

Figure 1:
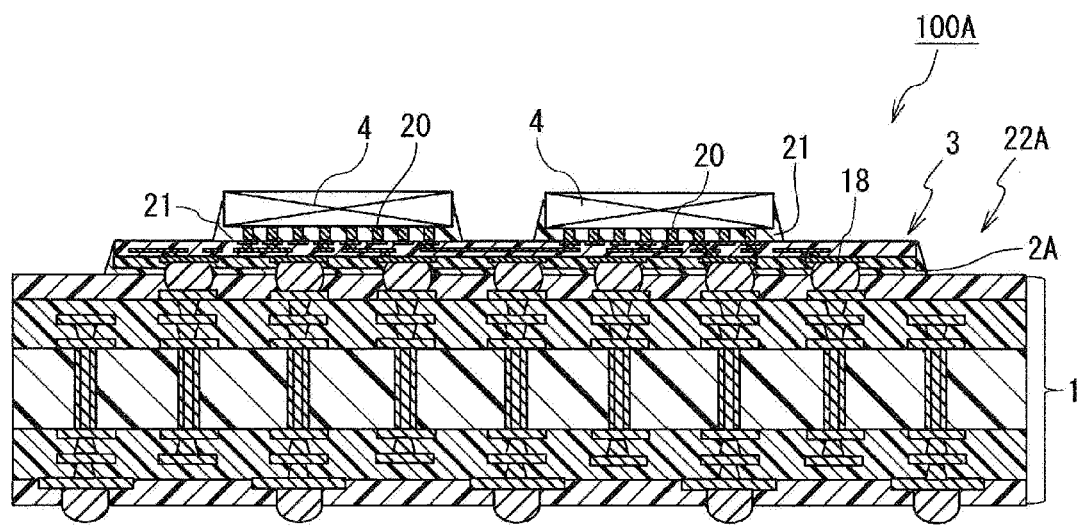
FIG. 1 is a schematic cross-sectional view illustrating a structural example of a semiconductor package produced using a first embodiment of the method of producing circuit boards of the present invention.

Specifically, FIG. 1 shows a semiconductor package 100 on which semiconductor elements are mounted. The package includes an FC-BGA circuit board component 1 as a first circuit board component and an interposer 3 as a second circuit board component. The FC-BGA circuit board component 1 has a surface (upper surface in FIG. 1) to which a surface of the interposer 3 (lower surface in FIG. 1) is bonded via joints 18, such as solder bumps, copper posts (copper pillars) or gold bumps. The interposer 3 is a thin layer having a fine wiring pattern, which is formed of only a buildup wiring layer that is a multi-wiring layer in which a plurality of insulating resin layers and wiring layers are laminated.

In a gap between the FC-BGA circuit board component 1 and the interposer 3, an underfill 2A that is an adhesive sealing resin having insulation properties is embedded. On the other surface of the interposer 3 (the upper surface in FIG. 1), i.e., on the surface facing away from the bonding surface to which the FC-BGA circuit board component 1 is connected, semiconductor elements 4 are bonded via joints 20 formed of copper pillars, solders at the edges of the copper pillars, and the like. In a gap between the semiconductor elements 4 and the interposer 3, an underfill 21 is embedded.

The underfill 2A is a material used for fixing the FC-BGA circuit board component 1 and the interposer 3 and sealing the joints 18. The material that can be used for the underfill 2A may be obtained, for example, by adding silica, titanium oxide, aluminum oxide, magnesium oxide, zinc oxide, or the like, as a filler, to one of an epoxy resin, urethane resin, silicone resin, polyester resin, oxetane resin, and maleimide resin, or a mixture of two or more these resins. The underfill 2A can be formed by filling the above materials in liquid form in the gap between the FC-BGA circuit board component 1 and the interposer 3, followed by curing.

The underfill 21 is an adhesive used for fixing the semiconductor chips 4 to the interposer 3 and sealing the joints 20, and is made of a material similar to that of the underfill 2A. Instead of filling the gaps with the underfills 2A and 21, i.e., liquid form resins, making use of the capillary phenomenon after bonding, an anisotropically conductive film (ACF) or a film-like connecting material (NCF), i.e., a sheet-like film, may be arranged in a space in advance before bonding to thereby fill the space with a sheet-like film when bonding, or a non-conductive paste (NCP) or the like, i.e., a liquid-form resin, may be arranged in a space in advance before bonding to thereby fill the space with a liquid resin when bonding.

The intervals of the joints 20 connecting between the interposer 3 and the semiconductor elements 4 are generally smaller than the intervals of the joints 18 connecting between the interposer 3 and the FC-BGA circuit board component 1. Therefore, the surface (upper surface in FIG. 1) of the interposer 3, i.e., the surface contacting the semiconductor elements 4, is required to have a finer wiring pattern than the other surface (lower surface in FIG. 1) thereof, i.e., the surface contacting the FC-BGA circuit board component 1.

For example, in order to meet the specification of currently used high bandwidth memories (HBMs), the interposer 3 is required to have a wiring pattern with a width of 2 μm or more and 6 μm or less. In order to match the characteristic impedance to 50Ω when the wiring pattern width is 2 μm and the wiring pattern height is 2 μm, the insulating film between the wiring components is required to have a thickness of 2.5 μm. Thus, the thickness of one layer including the wiring pattern will be 4.5 μm. If a five-layer interposer 3 is formed, with one layer having this thickness, the interposer 3 will have a total thickness of about 25 μm.

Figure 2:
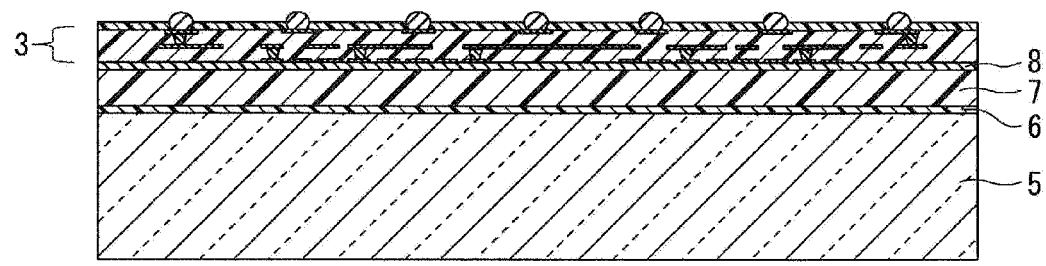
FIG. 2 is a schematic cross-sectional view illustrating a structural example of an interposer used in the first embodiment of the method of producing circuit boards of the present invention.

As mentioned above, the total thickness of the interposer 3 will be 25 μm which is so thin that it is difficult to bond the interposer 3 as it is to the FC-BGA circuit board component 1. Therefore, a support 5 may be effectively used to ensure rigidity of the interposer 3. Also, in order to form a wiring pattern having a width and a height of about 2 μm, the support 5 is required to be flat. For the reasons provided above, as shown in FIG. 2, the interposer 3 is formed on a rigid and flat support 5 via a release layer 6, a protective layer 7, and a seed layer 8. It should be noted that other layers than the release layer 6, the protective layer 7, and the seed layer 8 may be formed on the support 5.

Figure 3A:
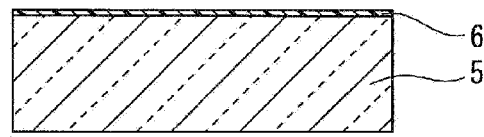
FIG. 3A is a cross sectional view illustrating a preparation procedure of the interposer illustrated in FIG. 2.
Figure 3B:
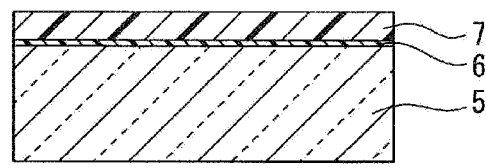
FIG. 3B is a cross-sectional view illustrating the preparation procedure following FIG. 3A.
Figure 3C:
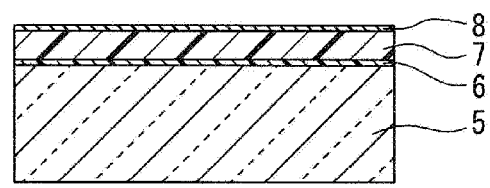
FIG. 3C is a cross-sectional view illustrating the preparation procedure following FIG. 3B.
Figure 3D:
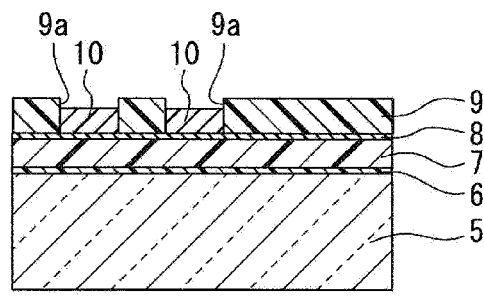
FIG. 3D is a cross-sectional view illustrating the preparation procedure following FIG. 3C.
Figure 3E:
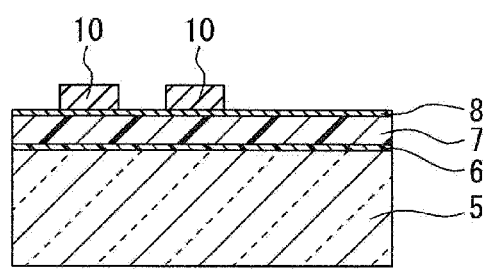
FIG. 3E is a cross-sectional view illustrating the preparation procedure following FIG. 3D.
Figure 3F:
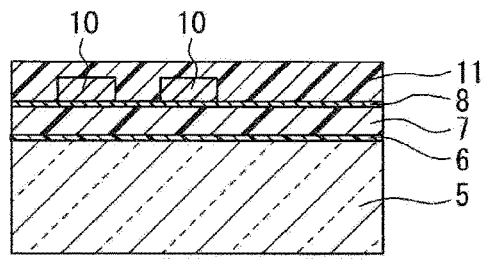
FIG. 3F is a cross-sectional view illustrating the preparation procedure following FIG. 3E.
Figure 3G:
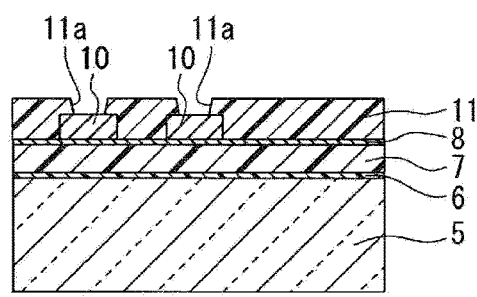
FIG. 3G is a cross-sectional view illustrating the preparation procedure following FIG. 3F.
Figure 3H:
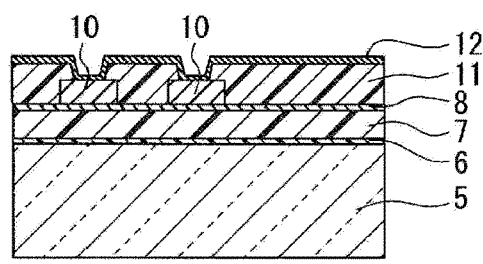
FIG. 3H is a cross-sectional view illustrating the preparation procedure following FIG. 3G.
Figure 3I:
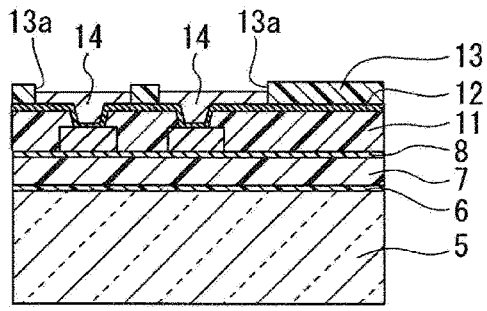
FIG. 3I is a cross-sectional view illustrating the preparation procedure following FIG. 3H.
Figure 3J:
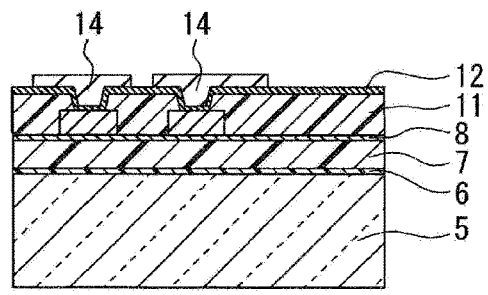
FIG. 3J is a cross-sectional view illustrating the preparation procedure following FIG. 3I.
Figure 3K:
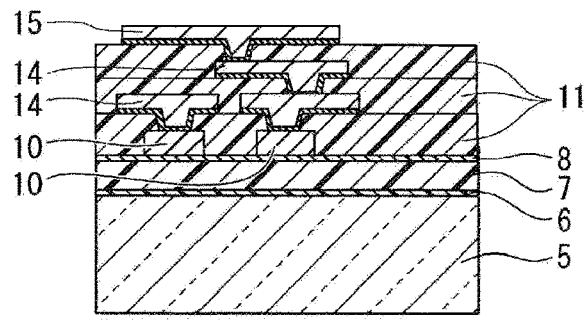
FIG. 3K is a cross-sectional view illustrating the preparation procedure following FIG. 3J.
Figure 3L:
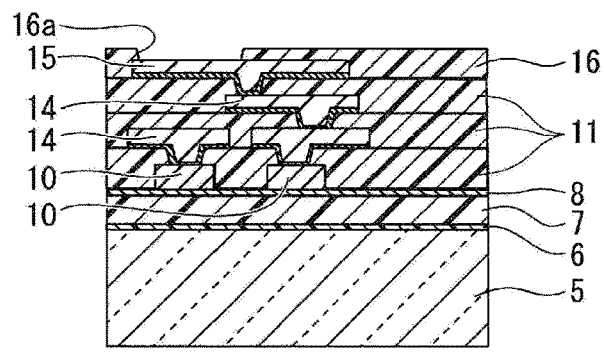
FIG. 3L is a cross-sectional view illustrating the preparation procedure following FIG. 3K.
Figure 3M:
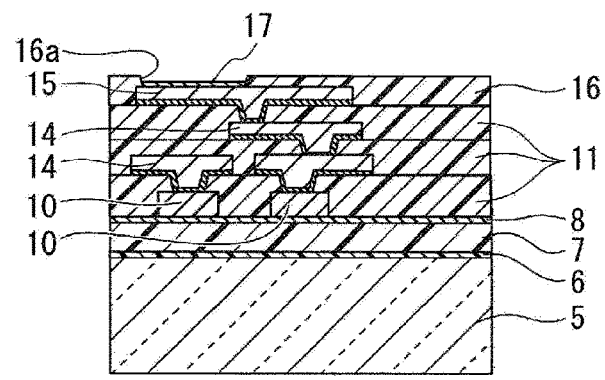
FIG. 3M is a cross-sectional view illustrating the preparation procedure following FIG. 3L.
Figure 3N:
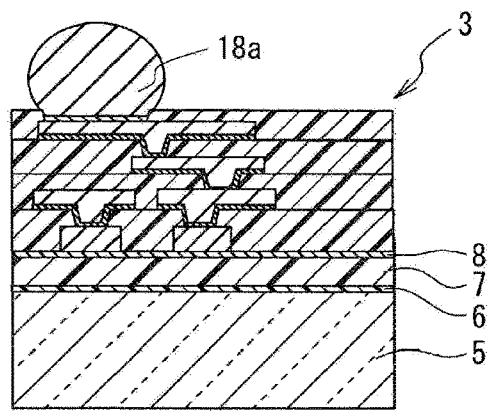
FIG. 3N is a cross-sectional view illustrating the preparation procedure following FIG. 3M.

Referring to FIGS. 3A to 3N, a method of preparing the interposer 3 (preparation steps for the second circuit board component) according to the present embodiment will be described.

First, as shown in FIG. 3A, a release layer 6 which is necessary for releasing the support 5 in a later step is formed on a surface of a support 5.

The release layer 6 may be, for example, made of a resin that can be released after being heated or altered due to absorption of light such as UV light, or a resin that can be released after foaming due to heat. If a resin that becomes releasable due to UV light or the like is used, the support 5 can be removed from the laminate of an interposer 3 and an FC-BGA circuit board component 1 by applying light to a surface of the support 5 facing away from the surface provided with the release layer 6.

In this case, the support 5 is required to be optically transparent and thus may be made of glass, for example. Glass has good flatness and is suitable for forming a fine pattern on the interposer 3. Also, glass has a small coefficient of thermal expansion (CTE) and is unlikely to be strained and accordingly ensures excellent pattern arrangement accuracy and flatness.

If glass is used as the support 5, the thickness of the glass is preferred to be large from the perspective of minimizing the occurrence of warpage in the preparation process and thus is preferred to be, for example, 0.7 mm or more, and is particularly preferred to be 1.1 mm or more. Furthermore, the CTE of the glass is preferred to be 3 ppm or more and 15 ppm or less and is particularly preferred to be about 9 ppm from the perspective of CTE of the FC-BGA circuit board component 1 and semiconductor elements 4.

If a resin that foams due to heat is used for the release layer 6, the support 5 can be removed by heating the laminate of the interposer 3 and the FC-BGA circuit board component 1. In this case, the support 5 may be made of, for example, metal, ceramics, or the like which are less likely to be strained.

In the present embodiment, a resin that becomes releasable due to absorption of UV light is used as the release layer 6, and glass is used as the support 5.

Next, as shown in FIG. 3B, a protective layer 7 is formed on the release layer 6. The protective layer 7 serves as a layer for protecting the interposer 3 when releasing the support 5 in a later step. For example, it may be made of a resin that is one of an epoxy resin, acrylic resin, urethane resin, silicone resin, polyester resin, and oxetane resin, or a mixture of two or more of these resins.

These resins can be removed after releasing the interposer 3 from the support 5. The protective layer 7 can be formed as appropriate according to the shape of the resin, using spin coating, a lamination process, or the like. In the present embodiment, the protective layer 7 is formed through a lamination process using an acrylic resin.

Next, as shown in FIG. 3C, a seed layer 8 is formed on the protective layer 7 in a vacuum. The seed layer 8 serves as a power supply layer for electroplating in a step of forming a wiring pattern. The seed layer 8 may be made of, for example, Cu, Ni, Al, Ti, Cr, Mo, W, Ta, Au, Ir, Ru, Pd, Pt, AlSi, AlSiCu, AlCu, NiFe, ITO, IZO, AZO, ZnO, PZT, TiN, $Cu_3N_4$, or a Cu alloy which are used singly or in combination of two or more, and can be formed by, for example, sputtering, CVD, or the like.

In the present embodiment, a titanium layer and then a copper layer are sequentially formed by sputtering, from the perspective of electrical characteristics, ease of preparation, cost, and the like. The total thickness of the titanium layer and the copper layer is preferred to be 1 μm or less as a power supply layer for electroplating. In the present embodiment the thickness of Ti is 50 nm and that of Cu is 300 nm.

Next, as shown in FIG. 3D, a resist pattern 9 is formed and conductive elements 10 serving as first electrodes are formed in respective openings 9a of the resist pattern 9. The conductive elements 10 are used as electrodes to achieve bonding with the semiconductor elements 4. The electroplating may be electroplating of nickel, copper, chromium, Pd, gold, rhodium, iridium, or the like. In particular, electroplating of copper is preferred because it is easy and inexpensive and achieves good electrical conductivity. The thickness of the electroplated copper is preferred to be 1 μm or more and 30 μm or less from the perspective of connection reliability for circuits, manufacturing cost, and the like. After that, as shown in FIG. 3E, the resist pattern 9 is removed.

Next, as shown in FIG. 3F, an insulating resin layer 11 is formed. The insulating resin layer 11 is formed so that the conductive elements 10 are embedded therein. The insulating resin layer 11 of the present embodiment is formed by spin-coating a photosensitive epoxy resin, for example. Photosensitive epoxy resins are cured at relatively low temperatures, and less likely to shrink due to curing after formation, and thus are excellent in fine pattern formation thereafter.

Other than the above method, the insulating resin layer 11 may also be formed by compressing and curing an insulating resin film using a vacuum laminator. In this case, an insulating film having good flatness can be formed. Also, for example, a polyimide may be used as an insulating resin.

Next, as shown in FIG. 3G, openings 11a are formed in the insulating resin layer 11 using photolithography or the like so as to be located above the respective conductive elements 10. The openings 11a may be subjected to plasma treatment for the purpose of removing residues produced during development.

Next, as shown in FIG. 3H, a seed layer 12 is provided on the surface of the insulating resin layer 11 and on the conductive elements 10 in the openings 11a. The seed layer 12 has a composition and a thickness which are similar to those of the seed layer 8 described above, but they may be appropriately changed as necessary. In the present embodiment, the seed layer 12 is formed by sputtering so that the thickness of Ti will be 50 nm and that of Cu will be 300 nm.

Next, as shown in FIG. 3I, a resist pattern 13 is formed on the seed layer 12 and conductive elements 14 serving as a wiring layer are formed by electroplating in openings 13a of the resist pattern 13. The conductive elements 14 serve as a wiring layer in the interposer 3. In the present embodiment, copper is used for the conductive elements 14. After that, as shown in FIG. 3J, the resist pattern 13 is removed. Then, unnecessary portions of the seed layer 12 are etched away.

Subsequently, the steps shown in FIGS. 3F to 3J are repeated a plurality of times to form a multi-wiring layer, as shown in FIG. 3K, in which insulating resin layers 11 and conductive elements 14 are laminated. It should be noted that conductive elements 15 located on the outermost surface are used as electrodes to be bonded to the FC-BGA circuit board component 1.

Next, as shown in FIG. 3L, an outermost insulating resin layer 16 is provided on the surface of the insulating resin layer 11 and on the conductive elements 15. The outermost insulating resin layer 16 is provided with openings 16a formed by exposure, development, and the like, so that the conducive elements 15 are partially exposed and the insulating resin layers 11 are covered. In the present embodiment, the outermost insulating resin layer 16 is formed using a photosensitive epoxy resin. The same material as that of the insulating resin layer 11 may be used for the outermost insulating resin layer 16.

Next, as shown in FIG. 3M, surface treatment films 17 are provided on the conductive elements 15 in the respective openings 16a to improve oxidation resistance of the surfaces of the conductive elements 15 and wettability of solder bumps. In the present embodiment, the surface treatment films 17 are formed by electroless plating of Ni/Pd/Au. It should be noted that OSP (surface treatment using organic solderability preservative/water-soluble preflux) films may be formed as the surface treatment films 17. Electroless plating of tin, electroless plating of Ni/Au, or electroless plating of other materials may be selected as appropriate according to usage.

Next, as shown in FIG. 3N, a solder material is mounted on the surface treatment films 17, melted, cooled, and fixed to form joints 18a that are solder bumps for bonding between the FC-BGA circuit board component 1 and the interposer 3. In the present embodiment, second electrodes are each configured by a conductive element 15, a surface treatment film 17, and a joint 18a. Thus, an interposer 3 formed on the support 5 can be obtained.

Figure 4A:
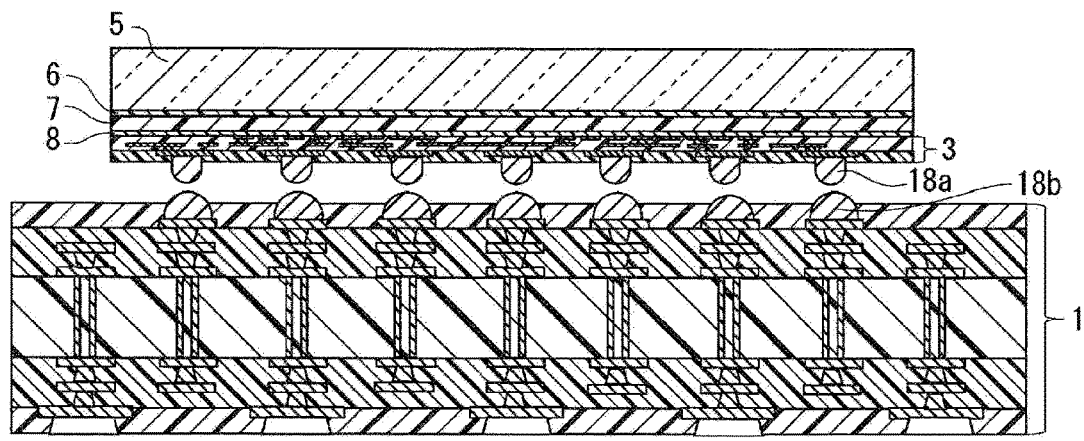
FIG. 4A is a cross-sectional view illustrating the preparation procedure following FIG. 3N.
Figure 4B:
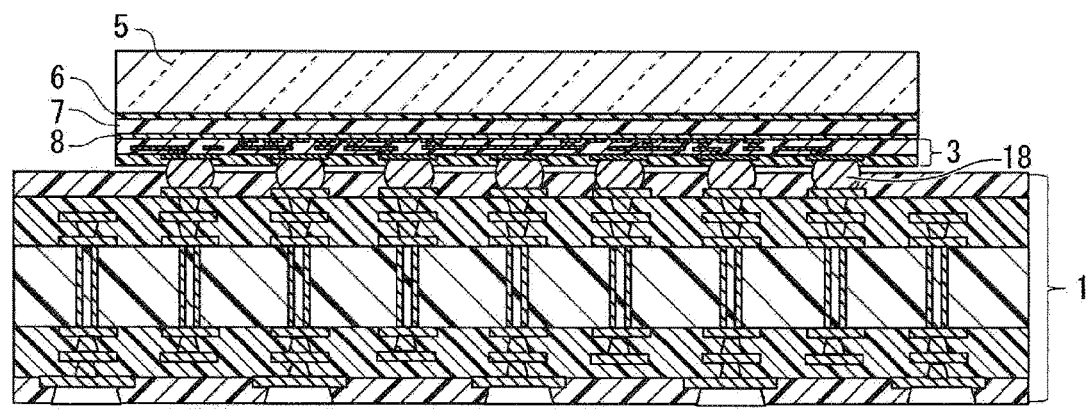
FIG. 4B is a cross-sectional view illustrating the preparation procedure following FIG. 4A.

Referring now to FIGS. 4A and 4B, steps of bonding the interposer 3 with the FC-BGA circuit board component 1 will be described.

The FC-BGA circuit board component 1 prepared herein includes joints 18b, as third electrodes, which are designed to match the respective joints 18a of the interposer 3. As shown in FIGS. 4A and 4B, the interposer 3 formed on the support 5 is disposed on and bonded to such an FC-BGA circuit board component 1 to form joints 18. Specifically, the interposer 3 is mounted on the FC-BGA circuit board component 1 using a mounter, and the joints 18a of the interposer 3 and the joints 18b of the FC-BGA circuit board component 1 are melted and bonded together using a conveyor type heating device (reflow) to form the joints 18.

If a flux is used for solder bonding, it is preferred that a flux cleaning step is performed after the bonding step. For the flux cleaning step, a direct pass cleaning device is preferred to be used; however, an ultrasonic cleaning device may be used.

Referring to FIGS. 5A to 5D, a method of placing the underfill 2A and a method of removing the support 5 according to the present embodiment will be described.

Figure 5A:
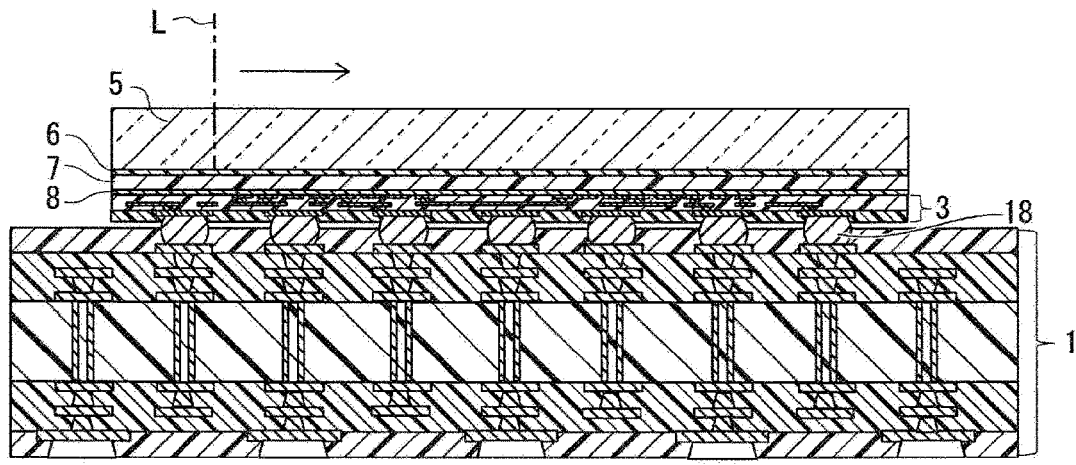
FIG. 5A is a cross-sectional view illustrating the preparation procedure following FIG. 4B.
Figure 5B:
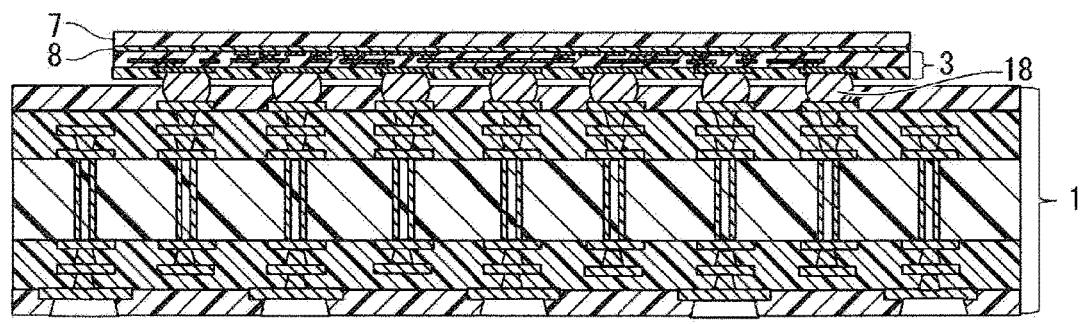
FIG. 5B is a cross-sectional view illustrating the preparation procedure following FIG. 5A.

First, as shown in FIG. 5A, laser light F that is UV light is applied to the release layer 6 via the support 5 to release the support 5. Specifically, the laser light F is applied to a surface of the interposer 3 (upper surface in FIG. 5A), i.e., the surface facing away from the surface to be connected to the FC-BGA circuit board component 1, via the support 5 to bring the release layer 6 formed at the interface with the support 5 into a releasable state. Then, as shown in FIG. 5B, the support 5 is detached via the release layer 6 (this step will be termed support release step hereinafter).

It should be noted that detachment of the support 5 depends on the characteristics of the release layer 6. If the retainability of the release layer 6 is deteriorated, the support 5 can be easily released when pulled. If the release layer 6 has high retainability, a sheet having high adhesion, for example, is adhered to the support 5 and pulled to release the support 5.

Figure 5C:
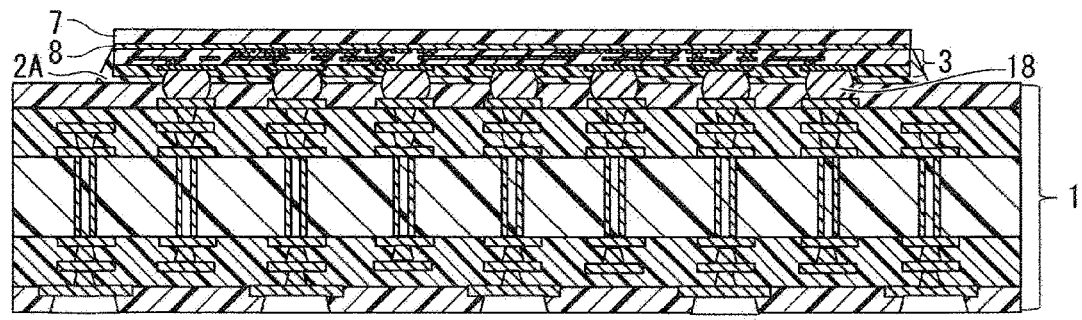
FIG. 5C is a cross-sectional view illustrating the preparation procedure following FIG. 5B.

Next, as shown in FIG. 5C, the underfill 2A is filled in the gap between the interposer 3 and the FC-BGA circuit board component 1 (this step will be termed resin supply step hereinafter). The underfill 2A is supplied using a dispenser that presses and injects the material with a syringe, and filled in the gap. The underfill 2A can be applied so as to be located adjacent to the interposer 3 using an air dispenser type or jet dispenser type underfill coating device, or the like. The applied underfill 2A is filled in the gap between the interposer 3 and the FC-BGA circuit board component 1 due to the capillary phenomenon.

If the supply amount of the underfill 2A per unit time is excessively large, the underfill 2A may rise up over the interposer 3. Therefore, in the present embodiment, the underfill 2A to be filled in the gap between the interposer 3 and the FC-BGA circuit board component 1 is supplied a plurality of times with a three or more-second interval therebetween, so that the underfill 2A will be prevented from rising up over the interposer 3.

The supplied underfill 2A is heated at a temperature that is not less than the curing temperature of the underfill 2A and then cured to fix the interposer 3 and the FC-BGA circuit board component 1 and seal the joints 18 (this step will be termed resin curing step hereinafter).

Figure 5D:
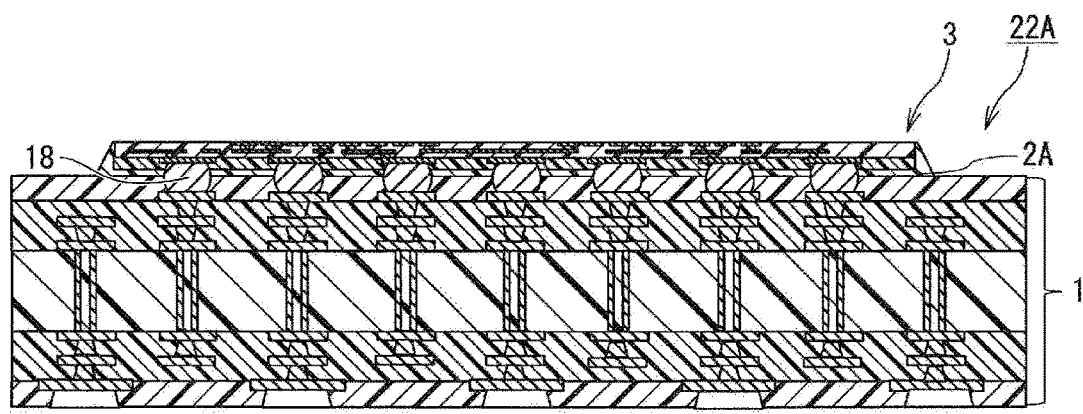
FIG. 5D is a cross-sectional view illustrating the preparation procedure following FIG. 5C.

After finishing the support release step, the resin supply step, and the resin curing step in this way, the protective layer 7 is removed, followed by removing the seed layer 8, as shown in FIG. 5D, to obtain a circuit board 22A. In the present embodiment, the protective layer 7 made of an acrylic resin is removed using an alkaline solvent (1% NaOH and 2.3% TMAH). Titanium and copper which sequentially form the seed layer 8 from the protective layer 7 side are respectively dissolved and removed using an alkaline etching agent and an acid etching agent. Thus, there is produced the circuit board 22A in which the interposer 3 and the FC-BGA circuit board component 1 are bonded together.

After this, the conductive elements 10 exposed to the surface may be further surface-treated such as by electroless plating of Ni/Pd/Au, OSP, electroless plating of tin, electroless plating of Ni/Au, or the like to prevent oxidation and improve wettability of the solder bumps.

In the production method of the circuit board 22A of the present embodiment, the support release step is sequentially followed by the resin supply step and the resin curing step. This method can prevent the underfill 2A from enclosing the support 5 and from fixing and holding the support 5 due to curing of the underfill 2A.

Therefore, in the production method for the circuit board 22A of the present embodiment, as described above, irradiation of the release layer 6 with the laser light L can easily and reliably release the support 5 from the protective layer 7.

Thus, according to the production method for the circuit board 22A of the present embodiment, yield can be improved in the step of releasing the support 5 to produce circuit boards with higher productivity.

Furthermore, since flux cleaning is performed before the support 5 is released from the interposer 3, the cleaning can be performed while the interposer 3 is protected by the support 5.

Also, since the gap between the FC-BGA circuit board component 1 and the interposer 3 can be sealed with the underfill 2A, the joints 18 can be protected from the alkaline etching agent and the acid etching agent used for removing the protective layer 7 and the seed layer 8, thereby preventing connection reliability from being deteriorated.

<Second Embodiment>

Referring to FIGS. 6 and 7A to 7D, a second embodiment of the method of producing circuit boards of the present invention will be described. It should be noted that like reference signs denote like components of the above embodiment to omit repeated explanation.

Figure 6:
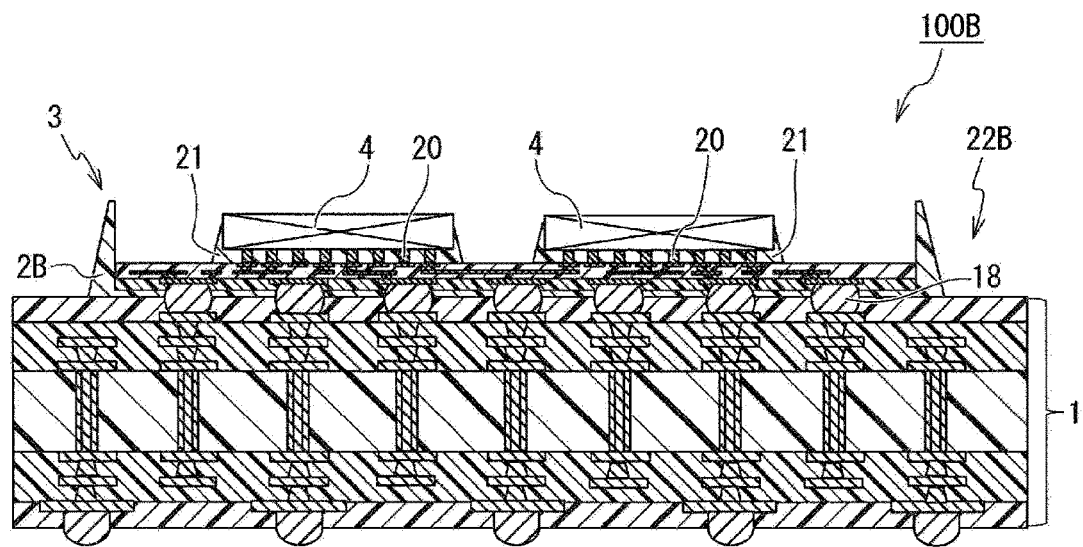
FIG. 6 is a schematic cross-sectional view illustrating a structural example of a semiconductor package produced using a second embodiment of the method of producing circuit boards of the present invention.

FIG. 6 shows a circuit board 22B of a semiconductor package 100B according to the present embodiment. In the circuit board 22B, an underfill 2B is formed so as to be located closer to the semiconductor elements 4 (upper side in FIG. 6) than to the surface of the interposer 3 connected to the semiconductor elements 4 (upper surface in FIG. 6). Other than the above, the circuit board 22B has a structure similar to the circuit board 22A of the semiconductor package 100A of the embodiment described above.

In the production method for the circuit board 22B of the present embodiment, steps up to the bonding step of forming the joints 18 by bonding the joints 18a of the interposer 3 with the joints 18b of the FC-BGA circuit board component 1 (step shown in FIG. 4B) are the same as those of the production method for the circuit board 22A of the embodiment described above.

Figure 7A:
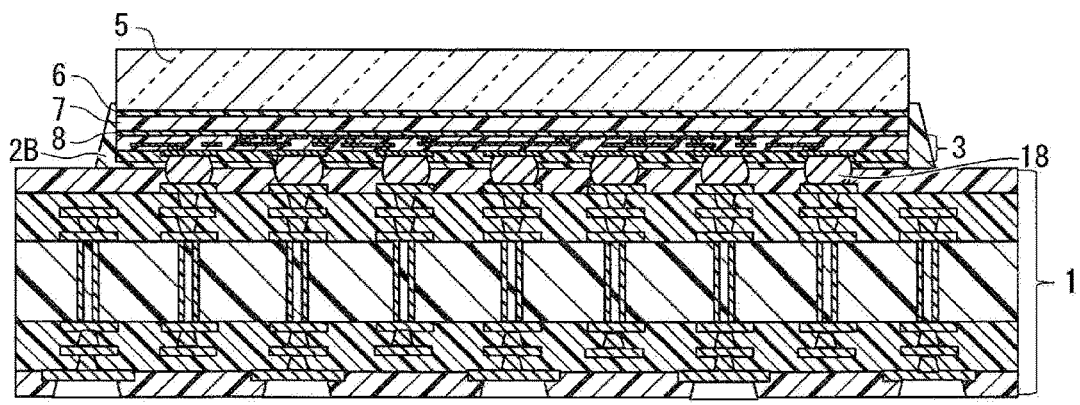
FIG. 7A is a cross-sectional view illustrating a preparation procedure following FIG. 4B, according to the second embodiment of the method of producing circuit boards of the present invention.

Next, as shown in FIG. 7A, the underfill 2B is supplied to enclose the interposer 3, the seed layer 8, the protective layer 7, the release layer 6, and the support 5, while sealing the gap between the interposer 3 and the FC-BGA circuit board component 1 to temporarily fix the interposer 3 formed on the support 5 and the FC-BGA circuit board component 1 (this step will be termed resin supply step hereinafter).

Figure 7B:
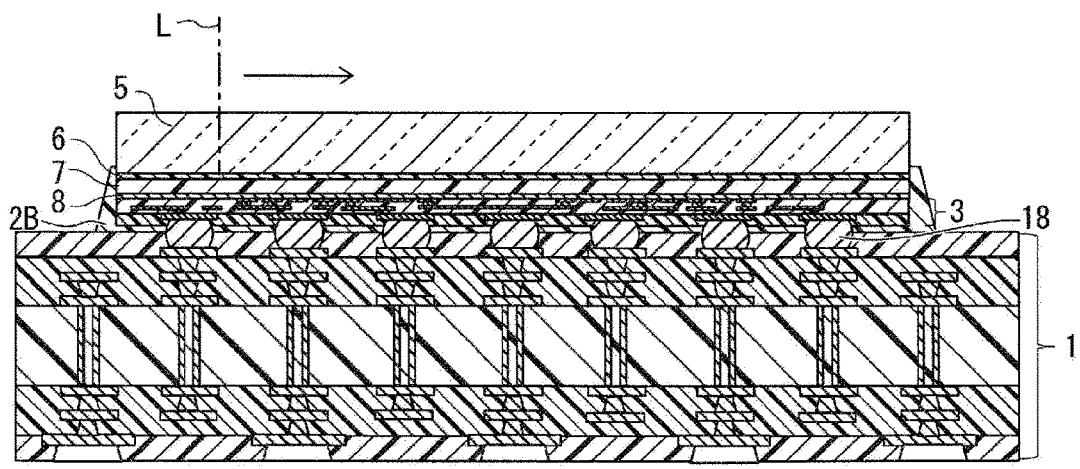
FIG. 7B is a cross-sectional view illustrating the preparation procedure following FIG. 7A.

Next, as shown in FIG. 7B, laser light L is applied to the release layer 6 via the support 5. Even though the laser light L is applied, the support 5 is not yet released because the underfill 2B is adhered to the outer periphery of the support 5. Subsequently, the underfill 2B is softened by heating to lower the adhesion of the underfill 2B, so that the support 5 can be brought into a state of being easily released from the underfill 2B (this step will be termed resin adhesion lowering step hereinafter).

Figure 7C:
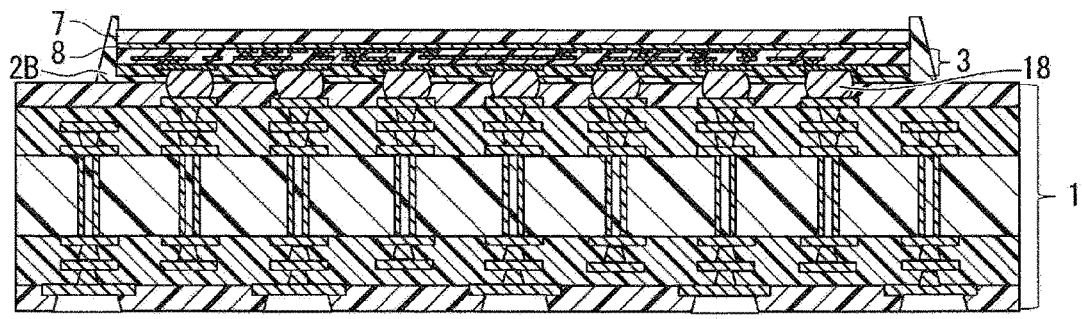
FIG. 7C is a cross-sectional view illustrating the preparation procedure following FIG. 7B.

Next, as shown in FIG. 7C, after removing the support 5 (this step will be termed support release step hereinafter), the underfill 2B is heated to the curing temperature or more, and then cured to fix the interposer 3 and the FC-BGA circuit board component 1 and seal the joints 18 (this step will be termed resin curing step hereinafter).

Figure 7D:
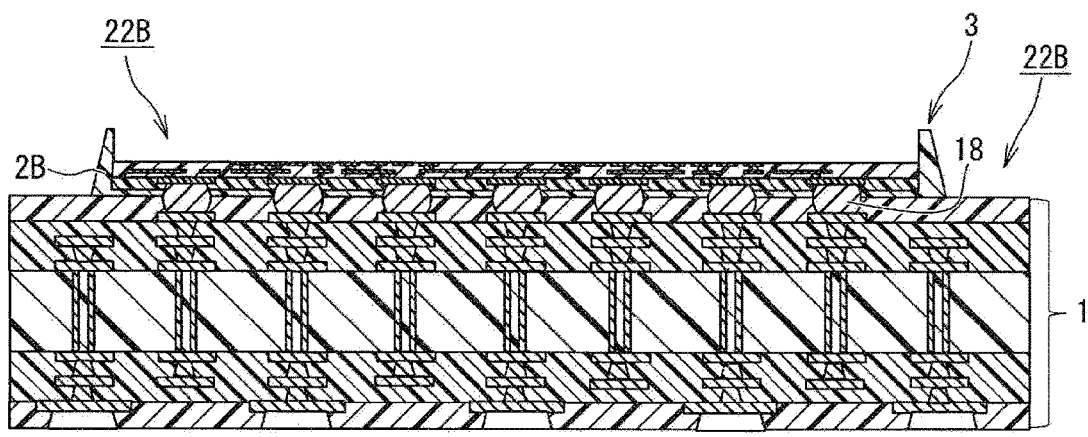
FIG. 7D is a cross-sectional view illustrating the preparation procedure following FIG. 7C.

Next, as shown in FIG. 7D, the protective layer 7 and the seed layer 8 are removed as in the above embodiment. Thus, there is produced the circuit board 22B in which the interposer 3 and the FC-BGA circuit board component 1 are bonded together.

In the production method for the circuit board 22B of the present embodiment, the resin supply step is followed by the resin adhesion lowering step which is sequentially followed by the support release step and the resin curing step. This method can release the support 5 from the underfill 2B adhered to the periphery of the support 5 and facilitate detachment of the support 5.

Thus, according to the production method for the circuit board 22B of the present embodiment, yield can also be improved in the step of releasing the support 5 to produce circuit boards with higher productivity.

<Third Embodiment>

Referring to FIGS. 8 and 9A to 9E, a third embodiment of the method of producing circuit boards of the present invention will be described. It should be noted that like reference signs denote like components of the above embodiments to omit repeated explanation.

Figure 8:
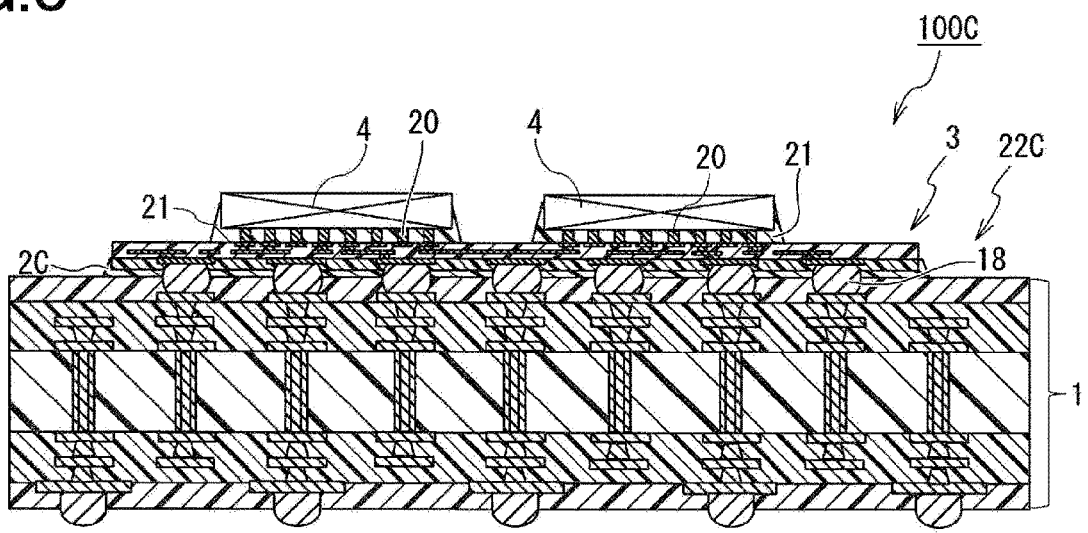
FIG. 8 is a schematic cross-sectional view illustrating a structural example of a semiconductor package produced using a third embodiment of the method of producing circuit boards of the present invention.

FIG. 8 shows a circuit board 22C of a semiconductor package 100C according to the present embodiment. In the circuit board 22C, an underfill 2C is formed so as to be located closer to the FC-BGA circuit board component 1 (lower side in FIG. 8) than to the surface of the interposer 3 connected to the semiconductor elements 4 (upper surface in FIG. 8). Other than the above, the circuit board 22C has a structure similar to the circuit boards 22A and 22B of the semiconductor packages 100A and 100B of the embodiments described above.

In the production method for the circuit board 22C of the present embodiment, steps up to the bonding step of forming the joints 18 by bonding the joints 18a of the interposer 3 with the joints 18b of the FC-BGA circuit board component 1 (step shown in FIG. 4B) are the same as those of the production methods for the circuit boards 22A and 22B of the embodiments described above.

Figure 9A:
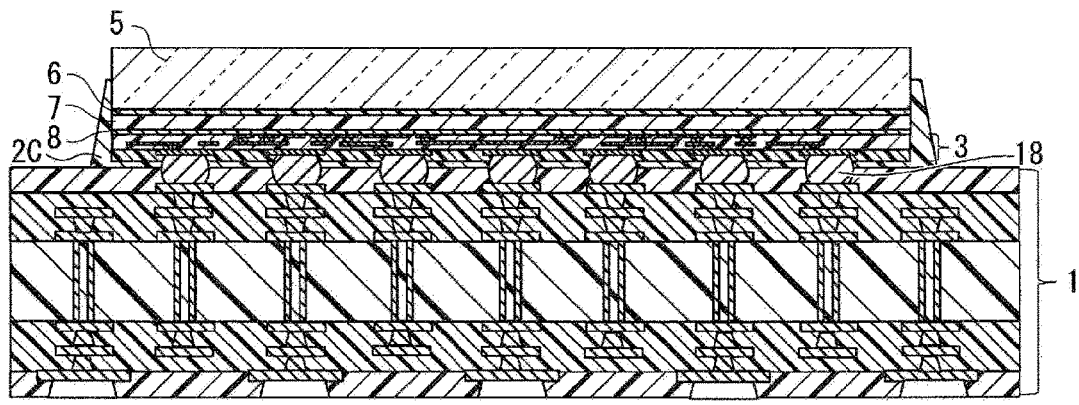
FIG. 9A is a cross-sectional view illustrating a preparation procedure following FIG. 4B, according to the third embodiment of the method of producing circuit boards of the present invention.
Figure 9B:
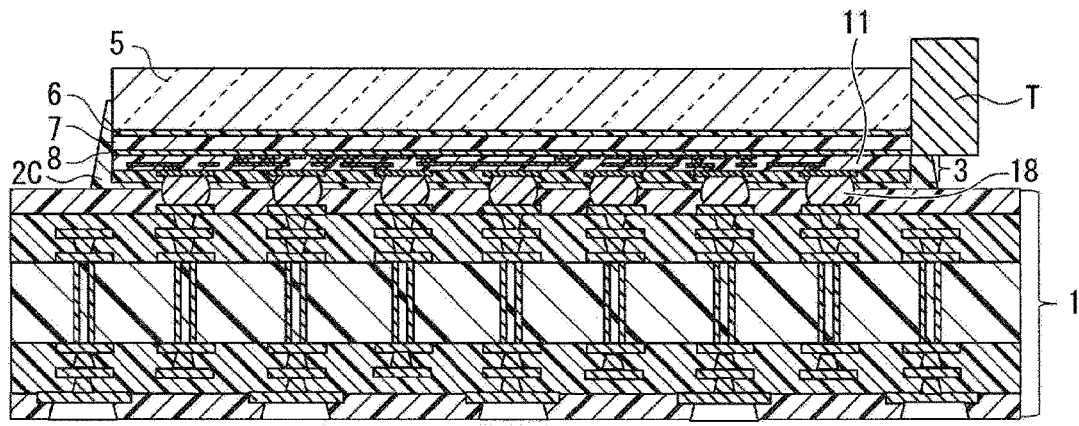
FIG. 9B is a cross-sectional view illustrating the preparation procedure following FIG. 9A.

Next, as shown in FIG. 9A, the underfill 2C is filled in the gap between the interposer 3 and the FC-BGA circuit board component 1 (this step will be termed resin supply step hereinafter). Next, as shown in FIG. 9B, an underfill removal jig T, such as a squeegee, is placed so as to contact the side surfaces (right and left surfaces and front and back surfaces as viewed in FIG. 9B) of the interposer 3. In this state, the jig is slidably moved over the outer periphery of the interposer 3 to scrape and remove the underfill 2C adhered to the side surfaces of the interposer 3, or at least the underfill 2C adhered closer to the support 5 than to the insulating resin layers 11 (this step will be termed resin removal step hereinafter).

Specifically, since the seed layer 8, the protective layer 7, and the release layer 6 are located closer to the support 5 than to the insulating resin layers 11, at least the underfill 2C adhered to the outer peripheries of the seed layer 8, the protective layer 7, and the release layer 6 is removed. In the present embodiment, only the underfill 2C located closer to the support 5 than to the insulating resin layers 11 is removed without removing the underfill 2C located on the side surfaces of the insulating resin layers 11.

As the underfill removal jig T, for example, a flat squeegee may be used. Such a squeegee is preferred to be tapered in the thickness direction at an end portion of the squeegee. A squeegee can be appropriately selected according to various conditions. Furthermore, the underfill removal jig T is preferred to be made of a material having relatively low hardness. For example, the material may be silicone rubber, urethane, Teflon (trademark), or other rubbers and plastics.

Figure 9C:
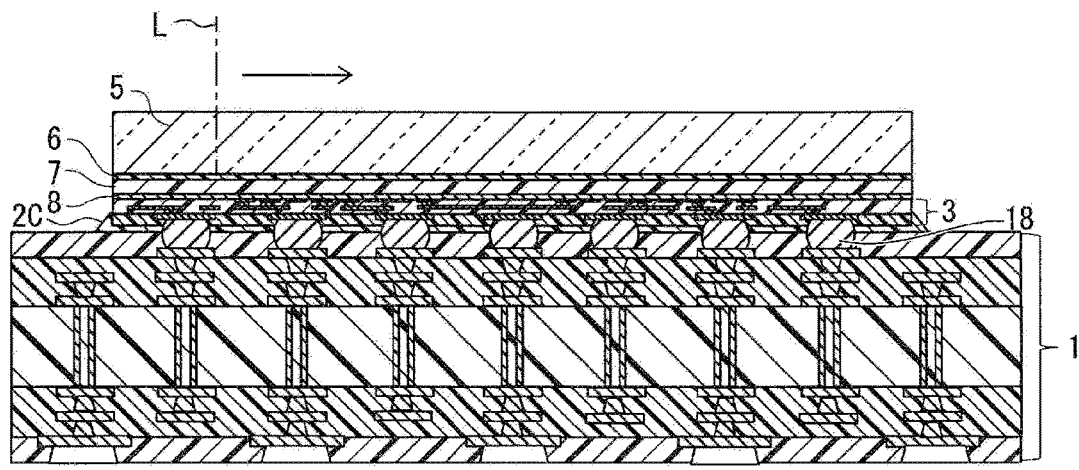
FIG. 9C is a cross-sectional view illustrating the preparation procedure following FIG. 9B.
Figure 9D:
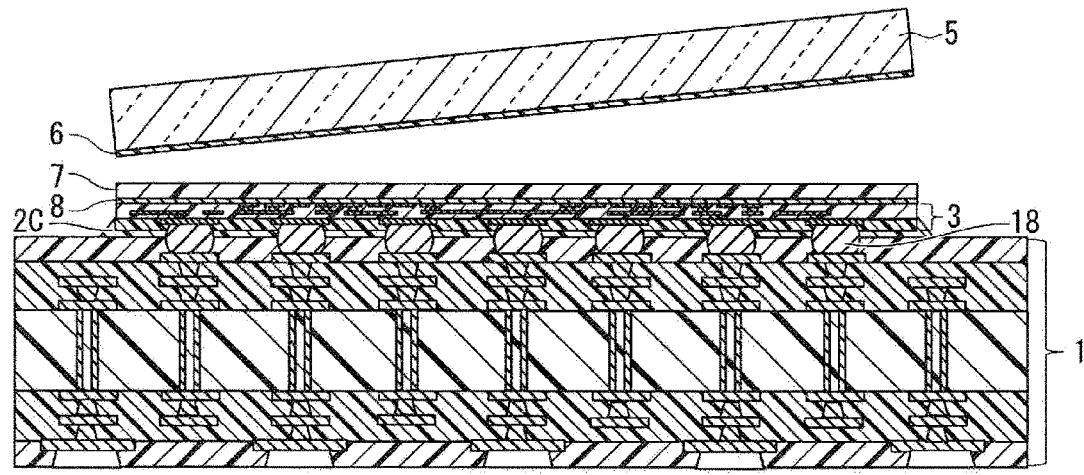
FIG. 9D is a cross-sectional view illustrating the preparation procedure following FIG. 9C.
Figure 9E:
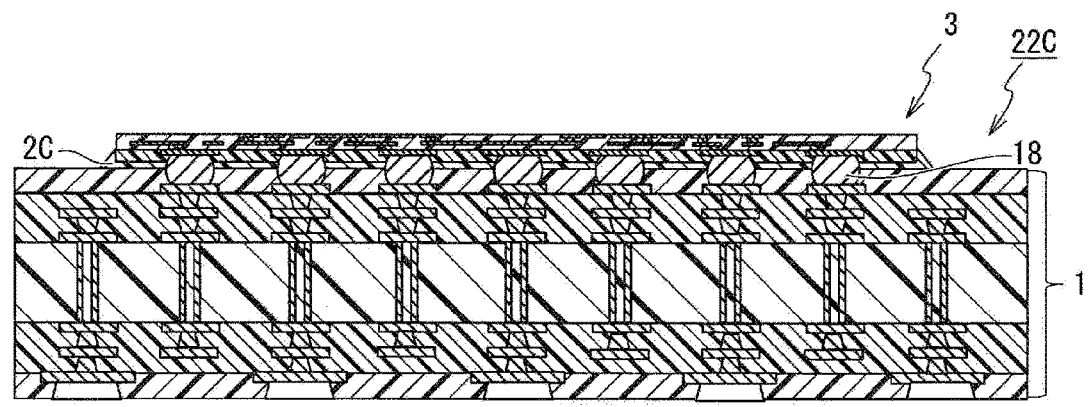
FIG. 9E is a cross-sectional view illustrating the preparation procedure following FIG. 9D.

Subsequently, the underfill 2C is cured by heating to fix the interposer 3 and the FC-BGA circuit board component 1 and seal the joints 18 (this step will be termed resin curing step hereinafter). Next, as shown in FIG. 9C, laser light L is applied to the release layer 6 via the support 5. Next, as shown in FIG. 9D, the support 5 is released as in the above embodiments. Next, as shown in FIG. 9E, the protective layer 7 and the seed layer 8 are removed as in the above embodiments (this step will be termed support release step hereinafter). Thus, there is produced the circuit board 22C in which the interposer 3 and the FC-BGA circuit board component 1 are bonded together.

In such a production method for the circuit board 22C of the present embodiment, the resin supply step is followed by the resin removal step of removing at least the underfill 2C located closer to the support 5 on the side surfaces of the interposer 3 than to the insulating resin layers 11, which is sequentially followed by the resin curing step and the support release step. Therefore, the shape of the underfill 2C after being cured can be controlled, regardless of the shape of the underfill 2C when supplied. Accordingly, the underfill 2C is prevented from fixing and holding the support 5 during curing.

Therefore, in the production method for the circuit board 22C of the present embodiment, irradiation of the release layer 6 with the laser light L can easily and reliably release the support 5 from the protective layer 7 as in the above embodiments.

Thus, according to the production method for the circuit board 22C of the present embodiment, yield can be improved in the step of releasing the support 5 to produce circuit boards with higher productivity as in the above embodiments.

Furthermore, due to the use of a material having relatively low hardness as mentioned above for the underfill removal jig T, the underfill removal jig T is enhanced in followability to the shapes of the side surfaces of the interposer 3. Therefore, the underfill 2C can be more reliably removed.

<Example 1 of Third Embodiment>

It should be noted that, in the third embodiment described above, a material having relatively high hardness may be used for the underfill removal jig T. Specifically, for example, any of Cu, Ti, Sn, Fe, Al, Cr, Ag, Au, Pt, Ni and Mn, or an alloy of two or more materials, or a complex of two or more materials, or other materials may be used. If a material having a relatively high hardness is used for the underfill removal jig T, deformation of the underfill removal jig T when removing the underfill 2C can be minimized, and position accuracy of the jig T when removing the underfill 2C can be enhanced.

<Example 2 of Third Embodiment>

In the third embodiment described above, a syringe needle connected to a suction mechanism may be used as the underfill removal jig T, so that the underfill 2C adhered to the outer periphery of the interposer 3 can be sucked and removed. Use of such a syringe needle connected to a suction mechanism as the underfill removal jig T can eliminate the issues of the underfill 2C spreading over the underfill removal jig T and re-adhering to the interposer 3 while being removed, and the removed underfill 2C spreading over the FC-BGA circuit board component 1 in the width direction.

<Example 3 of Third Embodiment>

In the third embodiment described above, a step of forming a mask may be performed prior to the resin supply step, and then the resin removal step may be performed, sequentially followed by a step of removing the mask, and the resin curing step.

Figure 10:
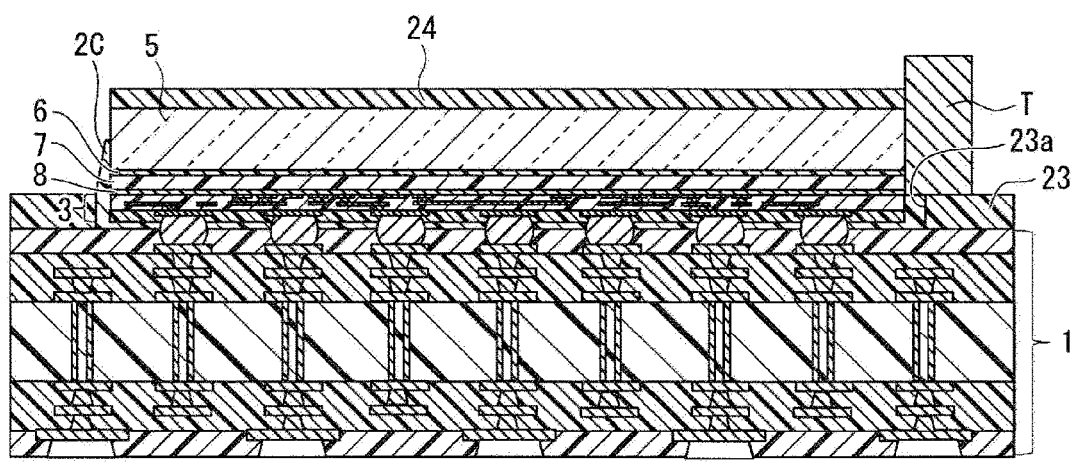
FIG. 10 is a cross-sectional view illustrating a preparation procedure according to Example 3 of the third embodiment of the method of producing circuit boards of the present invention.

Specifically, as shown in FIG. 10, a releasable first mask 23 may be partially formed on the surface of the FC-BGA circuit board component 1 facing the interposer 3, and a releasable second mask 24 may be formed on the surface of the support 5 facing away from the surface provided with the interposer 3.

The first and second masks 23 and 24 may be formed using a material that can be patterned and can be released. For example, a photosensitive dry film resist for forming wiring patterns, a liquid photosensitive resist, or the like may be used. If a photosensitive dry film resist is used, the first and second masks 23 and 24 may be formed through roll lamination, vacuum lamination, or the like. If a liquid photosensitive resist is used, the masks may be formed through spin coating, slit coating, screen printing, gravure offset printing, or the like.

In the first mask 23, an opening 23a is formed by photolithography, for filling the underfill 2C therefrom. The opening 23a of the first mask 23 may be formed throughout the outer periphery of the interposer 3, or may be formed only in a portion of the outer periphery. The first mask 23 has a thickness that is not more than the thickness of the interposer 3.

The underfill 2C is filled in the gap between the interposer 3 and the FC-BGA circuit board component 1 from such an opening 23a of the first mask 23, and the underfill 2C adhered to the outer periphery of the interposer 3 is removed using the underfill removal jig T in the manner described above. The underfill removal jig T is preferred to have a size (height) enabling the jig to abut against the first mask 23. After curing of the underfill 2C, the first and second masks 23 and 24 are removed. The first and second masks 23 and 24 are removed using a stripping solution which is used for stripping photosensitive resins.

In such a production method, the first mask 23 is partially formed on the surface of the FC-BGA circuit board component 1 facing the interposer 3 prior to the resin supply step, and then the resin removal step is performed, followed by removing the first mask 23 prior to the resin curing step. Therefore, the shape of the underfill 2C after being cured can be controlled with high accuracy. Specifically, for example, as shown in FIG. 10, the first mask 23 may be formed to have substantially the same thickness as that of the outermost insulating resin layer 16 of the interposer 3, so that the underfill removal jig T can be disposed abutting against the first mask 23. This enables removal of the underfill 2C located up to the boundary between the insulating resin layers 11 and the outermost insulating resin layer 16, i.e., up to the lowest level of the insulating resin layers 11.

Furthermore, the second mask 24 is formed on the surface of the support 5 facing away from the surface provided with the interposer 3 prior to the resin supply step, and then the resin removal step is performed, followed by removing the second mask 24 prior to the resin curing step. Therefore, the underfill 2C that has risen up over the surface of the support 5 facing away from the surface provided with the interposer 3 can be easily removed.

It should be noted that the above embodiments are only examples, and specific details of the structures may be modified as appropriate.

[Industrial Applicability]

The present invention can be applied to semiconductor devices including a circuit board which is provided with an interposer, or the like intervened between a main circuit board component and IC chips.

[Reference Signs List] 1 FC-BGA circuit board component (first circuit board component); 2A, 2B, 2C, 21 Underfill (sealing resin); 3 Interposer (second circuit board component); 4 Semiconductor element; 5 Support; 6 Release layer; 7 Protective layer; 8, 12 Seed layer; 9, 13 Resist pattern; 9a, 13a Opening; 10 Conductive element (first electrode); 11 Insulating resin layer; 11a Opening; 14 Conductive elements (wiring layer); 15 Conductive elements; 16 Outermost insulating resin layer; 16a Opening; 17 Surface treatment film; 18, 18a, 18b, 20 Joint; 22A, 22B, 22C Circuit board; 23 First mask; 23a Opening; 24 Second mask; L Laser light (UV light); T Underfill removal jig.

What is claimed is:

1. A method of producing circuit boards, the circuit boards each including a first circuit board component and a second circuit board component, the second circuit board component having a bonding surface on which a wiring pattern finer than that of the first circuit board component is formed and to which the first circuit board component is bonded, the second circuit board component having a surface on which semiconductor elements are mounted that faces away from the bonding surface, wherein the method comprises the steps of:

a second circuit board component preparation step of preparing the second circuit board component by performing a step of forming first electrodes on a support via a release layer for bonding to the semiconductor elements, a step of forming a multi-wiring layer, which is a laminate of a plurality of insulating resin layers and wiring layers, on the first electrodes, and a step of forming second electrodes on the multi-wiring layer for bonding to the first circuit board component; and a bonding step of bonding third electrodes of the first circuit board component to be connected to the second circuit board component, with the respective second electrodes of the second circuit board component;

followed by:

a resin supply step of filling a sealing resin in a gap between the first circuit board component and the second circuit board component;

a resin curing step of curing the sealing resin; and a support release step of releasing the support from the second circuit board component via the release layer, which are performed through any one of the following sequences which are:

(1) the support release step, the resin supply step, and the resin curing step;

(2) the resin supply step, the support release step, and the resin curing step; and (3) the resin supply step, a resin removal step of removing the sealing resin adhered to outer peripheries of the second circuit board component, the release layer, and the support, the resin curing step, and the support release step.

2. The method of producing circuit boards of claim 1, wherein the bonding step is followed by a flux cleaning step.

3. The method of producing circuit boards of claim 1, wherein the second circuit board component preparation step includes a step of forming a protective layer and a seed layer between the release layer and the first electrodes.

4. The method of producing circuit boards of claim 3, characterized in that the resin supply step, the support release step, and the resin curing step are followed by a step of removing the seed layer after removing the protective layer.

5. The method of producing circuit board of claim 1, wherein the sealing resin is filled a plurality of times in the resin supply step.

6. The method of producing circuit boards of claim 5, wherein the sealing resin is filled a plurality of times with a three-second or more interval therebetween in the resin supply step.

7. The method of producing circuit boards of claim 1, wherein in the second sequence, the resin supply step is sequentially followed by a resin adhesion lowering step of lowering adhesion of the sealing resin adhered to the outer peripheries of the second circuit board component, the release layer, and the support, and the support release step.

8. The method of producing circuit boards of claim 1, wherein the resin removal step is a step of scraping and removing the sealing resin using a squeegee.

9. The method of producing circuit boards of claim 1, wherein the resin removal step is a step of sucking and removing the sealing resin using a syringe needle.

10. The method of producing circuit boards of claim 1, wherein in the third sequence, a step of partially forming a first mask on a surface of the first circuit board component facing the second circuit board component is performed prior to the resin supply step, sequentially followed by the resin removal step, a step of removing the first mask, and the resin curing step.

11. The method of producing circuit boards of claim 1, wherein in the third sequence, a step of forming a second mask on a surface of the support facing away from the surface provided with the second circuit board component is performed prior to the resin supply step, sequentially followed by the resin removal step, a step of removing the second mask, and the resin curing step.

12. The method of producing circuit boards of claim 1, wherein the support is made of glass.

* * * * *